(12) United States Patent
Seiband et al.

(10) Patent No.: US 10,905,010 B2
(45) Date of Patent: Jan. 26, 2021

(54) CONNECTING ARRANGEMENT AND CORRESPONDING METHOD FOR MOUNTING AN ELECTRONIC COMPONENT ON A PRINTED CIRCUIT BOARD

(71) Applicant: Robert Bosch GmbH, Stuttgart (DE)

(72) Inventors: Helmut Seiband, Bobingen (DE); Michael Schlitzkus, Dietmannsried (DE); Sandra Heim, Bad Hindelang (DE); Stefan Lehenberger, Weitnau (DE); Valentin Notemann, Sonthofen (DE)

(73) Assignee: Robert Bosch GmbH, Stuttgart (DE)

( * ) Notice: Subject to any disclaimer, the term of this patent is extended or adjusted under 35 U.S.C. 154(b) by 221 days.

(21) Appl. No.: 15/994,219

(22) Filed: May 31, 2018

(65) Prior Publication Data
US 2018/0352657 A1 Dec. 6, 2018

(30) Foreign Application Priority Data

May 31, 2017 (DE) ........................ 10 2017 209 097

(51) Int. Cl.
*H05K 3/34* (2006.01)
*H05K 1/18* (2006.01)
(Continued)

(52) U.S. Cl.
CPC ............ *H05K 1/181* (2013.01); *G01D 11/30* (2013.01); *H01R 12/57* (2013.01); *H01R 12/592* (2013.01);
(Continued)

(58) Field of Classification Search
CPC ........ G01D 11/30; H05K 1/111; H05K 1/181; H05K 3/3421; H05K 3/3426;
(Continued)

(56) References Cited

U.S. PATENT DOCUMENTS

| | | | | |
|---|---|---|---|---|
| 5,144,535 A | * | 9/1992 | Megens | ................. H05K 3/328 361/760 |
| 5,369,551 A | * | 11/1994 | Gore | .................... H05K 1/0243 174/261 |
| 6,046,882 A | * | 4/2000 | Pattanaik | ............. H05K 3/3442 29/878 |
| 6,259,345 B1 | * | 7/2001 | De Graaf | .......... B29C 45/14639 29/602.1 |

(Continued)

FOREIGN PATENT DOCUMENTS

CN 203882995 U 10/2014

*Primary Examiner* — Paul D Kim
(74) *Attorney, Agent, or Firm* — Maginot, Moore & Beck LLP

(57) ABSTRACT

A connecting arrangement includes an electronic component and a printed circuit board, and a method includes establishing a solder connection between the component and circuit board. The component has a housing with a support area, and a contact element with a first contact area running parallel to the support area of the housing, a second contact area at a prespecified angle relative to the first contact area, and a rounded transition region formed between the first and second contact areas. The circuit board has a first surface with a soldering area including a constriction, a first section, and a second section connected to the first section via the constriction. The transition region is in a region of the constriction. The second contact area is connected to the second section via a solder connection. The support area is at an angle relative to the first surface corresponding to the prespecified angle.

10 Claims, 3 Drawing Sheets

(51) Int. Cl.
- *H01R 12/57* (2011.01)
- *H05K 1/11* (2006.01)
- *G01D 11/30* (2006.01)
- *H01R 12/59* (2011.01)

(52) U.S. Cl.
CPC .......... *H05K 1/111* (2013.01); *H05K 3/3421* (2013.01); *H05K 3/3426* (2013.01); *H05K 3/3494* (2013.01); *H05K 2201/10151* (2013.01); *H05K 2201/10454* (2013.01); *H05K 2201/10628* (2013.01); *H05K 2201/10757* (2013.01)

(58) Field of Classification Search
CPC .... H05K 3/3494; H05K 12/57; H05K 12/592; H05K 2201/10151; H05K 2201/10454; H05K 2201/10628; H05K 2201/10757
See application file for complete search history.

(56) References Cited

U.S. PATENT DOCUMENTS

| | | | |
|---|---|---|---|
| 9,082,868 B2* | 7/2015 | Lee | H01L 24/80 |
| 2006/0205111 A1* | 9/2006 | Gross | H01L 25/0657 |
| | | | 438/106 |
| 2006/0236527 A1* | 10/2006 | Davis | G11B 5/4826 |
| | | | 29/603.12 |
| 2007/0211387 A1* | 9/2007 | Ohwe | G11B 5/4853 |
| | | | 360/245.9 |
| 2008/0151428 A1* | 6/2008 | Kushima | G11B 5/4853 |
| | | | 360/235.4 |
| 2010/0214697 A1* | 8/2010 | Yao | H05K 1/111 |
| | | | 360/246.2 |
| 2011/0016685 A1* | 1/2011 | Kawao | H05K 3/3442 |
| | | | 29/402.03 |
| 2011/0205711 A1* | 8/2011 | Lischeck | H05K 7/20454 |
| | | | 361/720 |
| 2017/0290546 A1* | 10/2017 | Antonio | A61B 5/14865 |

* cited by examiner

CONNECTING ARRANGEMENT AND CORRESPONDING METHOD FOR MOUNTING AN ELECTRONIC COMPONENT ON A PRINTED CIRCUIT BOARD

This application claims priority under 35 U.S.C. § 119 to patent application no. DE 10 2017 209 097.9, filed on May 31, 2017 in Germany, the disclosure of which is incorporated herein by reference in its entirety.

The disclosure is based on a connecting arrangement. The present disclosure also relates to a method for mounting an electronic component on a printed circuit board.

BACKGROUND

As is known from the prior art, SMD (surface-mount device) technology is predominantly used in the production of electronic components. In contrast to wired components in through-hole mounting, SMD components have the advantage that all of the production steps can be performed in a fully automatic manner. In the previous methods for mounting electronic components, which are designed as SMD components, known from the prior art, the SMD components are soldered parallel to the printed circuit board surface. However, electronic components which are perpendicular to the printed circuit board are often also required. This is desired, for example, in the case of integrated circuits which have a sensitive area or sensor area which should not be arranged parallel but rather perpendicular to the printed circuit board. In the case of these components, it is difficult to execute the populating operation and the soldering process in an automated manner.

SUMMARY

The connecting arrangement according to this disclosure has the advantage that fitting and soldering of electronic components, which are not arranged parallel but rather at a prespecified angle, in particular perpendicular, in relation to the printed circuit board, can take place in an automated manner.

Owing to the design of the soldering area with two sections which are connected to one another by means of a constriction, and the design of the contact elements with two contact areas which are at a prespecified angle in relation to one another and between which a rounded transition region is formed, it is advantageously possible to position the electronic component, which is preferably designed as an SMD component, in a first soldering process and then to tilt the said electronic component through a prespecified angle in a second soldering process. The two soldering processes are preferably executed as a reflow soldering processes in a reflow soldering furnace.

The method for mounting an electronic component on a printed circuit board according to this disclosure has the advantage that the electronic components can be fitted and soldered perpendicular to the printed circuit board surface in an automated manner. Since, in contrast to known mounting methods, no contact-reconnection operations by means of press-in pins, further printed circuit boards, auxiliary components etc. are required, the number of components can be reduced and resources can be saved in an advantageous manner. As a result, process and manual working steps can additionally be reduced during the mounting method and therefore cost savings can be made. Since the components are held only by surface tension and adhesive forces of the soldering paste during the soldering processes, better floating of the contact areas of the components on the soldering areas of the printed circuit board is advantageously possible. In addition, components can be mounted on two planes instead of on one plane, as before, so that 90° contact-reconnection is possible.

Embodiments of the present disclosure provide a connecting arrangement comprising an electronic component, which has a housing with a support area and at least one contact element, and a printed circuit board, which has at least one soldering area which is arranged on a first surface. The contact element has a first contact area which runs parallel to the support area of the housing. In this case, the soldering area comprises a first section and a second section, which sections are connected to one another by means of a constriction. The contact element comprises a second contact area which is at a prespecified angle in relation to the first contact area. A rounded transition region is formed between the first contact area and the second contact area and is arranged in the region of the constriction of the soldering area. In addition, the second contact area is connected to the second section of the soldering area by means of a solder connection, and the support area of the housing is at an angle in relation to the first surface of the printed circuit board, which angle corresponds to the angle between the first contact area and the second contact area.

The disclosure additionally proposes a method for mounting an electronic component on a printed circuit board. In this case, the electronic component has a housing with a support area and at least one contact element, and the printed circuit board has at least one soldering area which is arranged on a first surface. The at least one contact element has a first contact area, which runs parallel to the support area of the housing, and a second contact area, which is at a prespecified angle in relation to the first contact area. A rounded transition region is formed between the first contact area and the second contact area. The at least one soldering area comprises a first section and a second section, which sections are connected to one another by means of a constriction. The method comprises the steps of: applying soldering paste to the at least one soldering area of the printed circuit board, populating the printed circuit board with at least one electronic component in such a way that the housing rests by way of the support area on the first surface of the printed circuit board, and the first contact area of the at least one contact element rests on the first section of the at least one soldering area, and the transition region is arranged in the region of the constriction, executing a first soldering process with the populated printed circuit board, in which the printed circuit board is supplied to a soldering furnace with the first surface pointing upward and the first contact area of the at least one contact element floats on the first section of the at least one soldering area, rotating the printed circuit board through 180°, executing a second soldering process with the populated printed circuit board, in which the printed circuit board is supplied to the soldering furnace with the first surface pointing downward, in which soldering furnace the soldering paste on the at least one soldering area is liquefied again, so that the housing of the electronic component, by way of its support area, lifts away from the printed circuit board on account of the active force of gravity with a tilting movement over the rounded transition region of the at least one contact element, and the second contact area floats on the second section of the at least one soldering area and the support area of the housing is at a prespecified angle in relation to the first surface of the printed circuit board, curing the solder connection between the second contact area of the at least one contact element and the second section of the at least one soldering area.

In the present case, an electronic component can be understood to mean any electrical or electronic component, such as for example a discrete circuit component having a housing and at least one contact element which is routed out of the housing, such as a transistor or a sensor, but also a complex integrated circuit which is arranged in a housing of the said kind. The electronic component is preferably designed as an SMD component. In the case of a sensor, at least one side of the housing is designed as a sensor area or has a window through which soundwaves and/or electromagnetic waves can be emitted or received. The sensor can comprise, for example, an optical sensor element which has, for example, a photo plate and/or a fluorescent area and/or a semiconductor which detect incidence or intensity, wavelength, frequency, angle etc. of the waves which are received via the sensor area or the window, such as infrared sensor elements for example. Similarly, an acoustic sensor element is feasible, such as for example an ultrasonic sensor element and/or a high-frequency sensor element and/or a radar sensor element and/or a sensor element which reacts to a magnetic field, such as for example a Gall sensor element and/or a magnetoresistive sensor element and/or an inductive sensor element which records the change in a magnetic field, for example by means of the voltage which is produced by magnetic induction.

Advantageous improvements to the connecting apparatus and to the method for mounting an electronic component on a printed circuit board are possible by way of the measures and developments presented in the description, claims, and drawings.

It is particularly advantageous that the angle between the first contact area and/or the support area and the second contact area and/or the first surface can have a value in the range of from 45° to 90° in each case. As a result, components can be advantageously mounted on two planes and 90° contact-reconnection is possible.

In an advantageous refinement of the connecting arrangement, the surface area of the first section of the at least one soldering area can be designed to be greater than the surface area of the first contact area of the at least one contact element. In addition, the surface area of the second section of the at least one soldering area can be designed to be greater than the surface area of the second contact area of the at least one contact element. This means that the dimensions of the contact areas and the sections of the soldering areas can be matched to one another, wherein the sections of the soldering area are designed to be somewhat larger in order to allow the contact areas to float. In addition, the second contact area of the at least one contact element is designed to be shorter than the first contact area, and the second section of the at least one soldering area is designed to be shorter than the first section. The relatively large first section and the relatively large first contact area facilitate positioning and floating during the first soldering process.

In a further advantageous refinement of the connecting arrangement, the electronic component can be designed as a sensor element with a sensor area. In this case, the sensor area can preferably be arranged on a housing side of the electronic component, which housing side is arranged opposite the support area, or can be arranged on the housing side of the support area of the electronic component. The orientation of the sensor area in relation to the surface of the printed circuit board can be prespecified in any desired manner by way of the value of the prespecified angle between the first contact area and the second contact area.

In a further advantageous refinement of the method for mounting an electronic component on a printed circuit board, the rotation of the printed circuit board can be carried out before the solder connection between the first contact area of the at least one contact element and the first section of the at least one soldering area is cured. As a result, a more rapid second soldering process is possible since the time which is required in order to liquefy the soldering paste on the soldering area again is shorter. In addition, less thermal energy has to be supplied.

BRIEF DESCRIPTION OF THE DRAWINGS

Exemplary embodiments of the disclosure are illustrated in the drawings and will be explained in greater detail in the following description. In the drawings, identical reference symbols identify components or elements which execute the same or analogous functions.

In the drawings.

DETAILED DESCRIPTION

Figure 1:
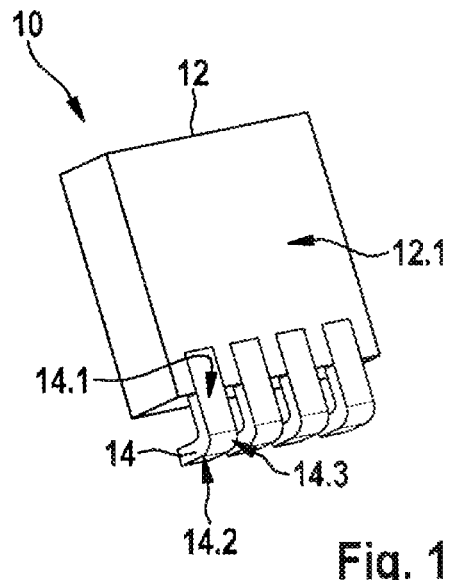
FIG. 1 shows a schematic perspective illustration of an exemplary embodiment of an electronic component for a connecting arrangement according to the disclosure.

As shown in FIGS. 1 to 5, the illustrated exemplary embodiment of a connecting arrangement 1 according to the disclosure comprises an electronic component 10, which has a housing 12 with a support area 12.1 and at least one contact element 14, and a printed circuit board 20 which has at least one soldering area 24 which is arranged on a first surface 22. As is further shown in FIGS. 1 to 5, the illustrated electronic component 10 has four contact elements 14. The illustrated detail of the printed circuit board 20 has four corresponding conductor tracks 24 which are intended to be electrically and mechanically connected to the four contact elements 14 by means of soldering points. The contact element 14 each have a first contact area 14.1 which runs parallel to the support area 12.1 of the housing 12. In this case, the soldering areas 24 each comprise a first section 24.1 and a second section 24.2, which sections are connected to one another by means of a constriction 24.3 in each case. The contact elements 14 each comprise a second contact area 14.2 which is at a prespecified angle in relation to the corresponding first contact area 14.1. A respective rounded transition region 14.3 is formed between the first contact area 14.1 and the second contact area 14.2 of the contact elements 14 and is arranged in the region of the constriction 24.3 of the soldering area 24. The second contact area 14.2 is connected to the second section 14.2 of the soldering area 24 by means of a solder connection, and the support area 12.1 of the housing 12 is at an angle in relation to the first surface 22 of the printed circuit board 20, which angle corresponds to the prespecified angle between the first contact area 14.1 and the second contact area 14.2.

In the illustrated exemplary embodiment, the electronic component 10 is designed as a sensor element with a sensor area 12.2 and is of SMD design. In this case, the support area 12.1 is arranged on one housing side and the sensor area 12.2 is arranged on a housing side of the electronic component 10, which housing side is arranged opposite to the support area 12.1.

Figure 5:
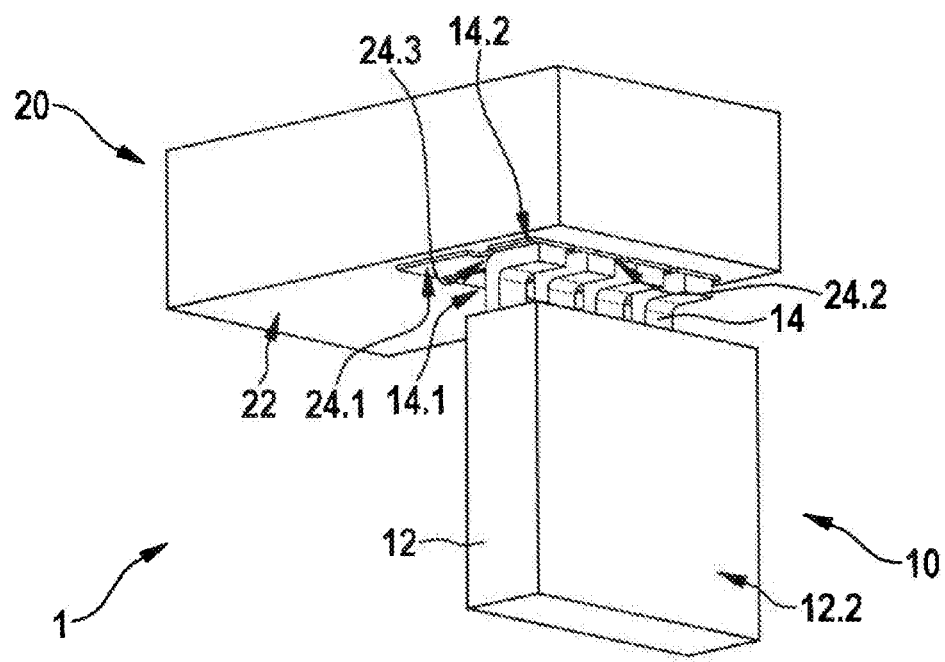
FIG. 5 shows a schematic perspective illustration of an exemplary embodiment of a connecting arrangement according to the disclosure comprising the printed circuit board from FIG. 2 and the electronic component from FIG. 1.

As is shown in FIG. 5 in particular, the angle between the first contact area 14.1 and the second contact area 14.2 and, respectively, between the support area 12.1 of the housing 12 and/or the first surface 22 of the printed circuit board 20 in the illustrated exemplary embodiment each have a value of 90°. This means that the support area 12.1 and the sensor area 12.2 are oriented perpendicular in relation to the first surface 22 of the printed circuit board 20. It goes without saying that the support area 12.1 and, respectively, the sensor area 12.2 can also be oriented at another angle in the range of from 45° to 90° in relation to the first surface 22 of the printed circuit board 20.

Figure 3:
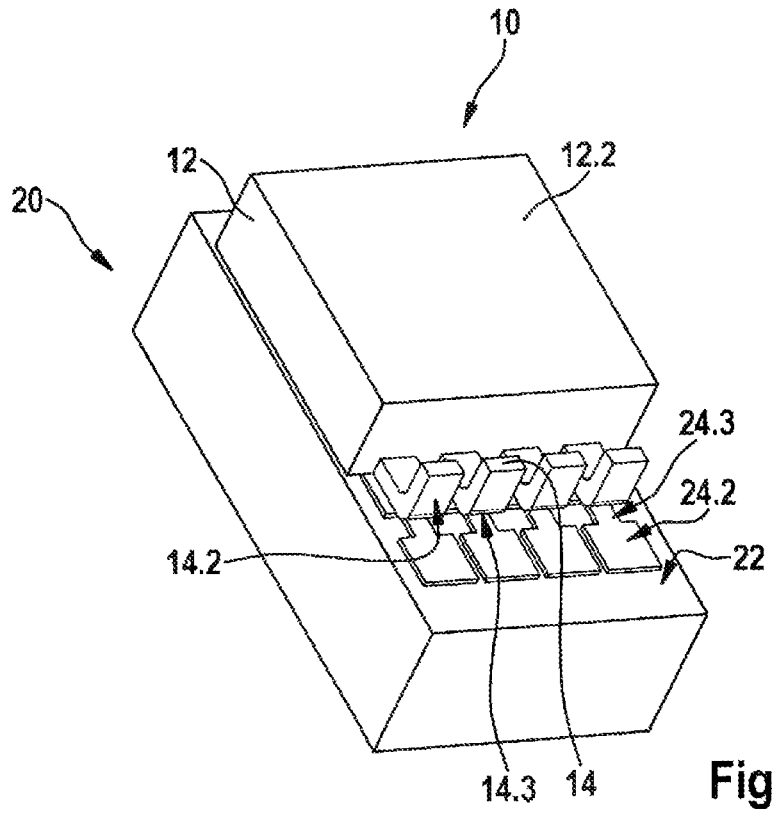
FIG. 3 shows a schematic perspective illustration of the printed circuit board from FIG. 2 with the electronic component from FIG. 1 before the first soldering process.

As is further shown in FIG. 3 in particular, the surface area of the first section 24.1 of the at least one soldering area 24 is designed to be greater than the surface area of the first contact area 14.1 of the at least one contact element 14. In addition, the surface area of the second section 24.2 of the at least one soldering area 24 is designed to be greater than the surface area of the second contact area 14.2 of the at least one contact element 14.

Figure 2:
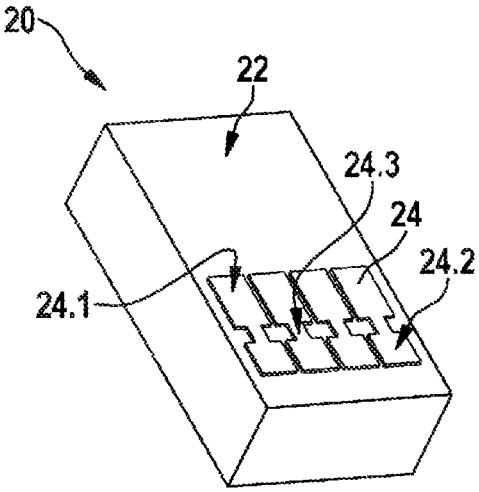
FIG. 2 shows a schematic perspective illustration of a detail of an exemplary embodiment of a printed circuit board for a connecting arrangement according to the disclosure.

As is further shown in FIG. 2 in particular, the second section 24.2 of the at least one soldering area 24 is designed to be shorter than the first section 24.1 in the illustrated exemplary embodiment. As is further shown in FIG. 1 in particular, the second contact area 14.2 of the at least one contact element 14 is designed to be shorter than the first contact area 14.1 in the illustrated exemplary embodiment.

Figure 4:
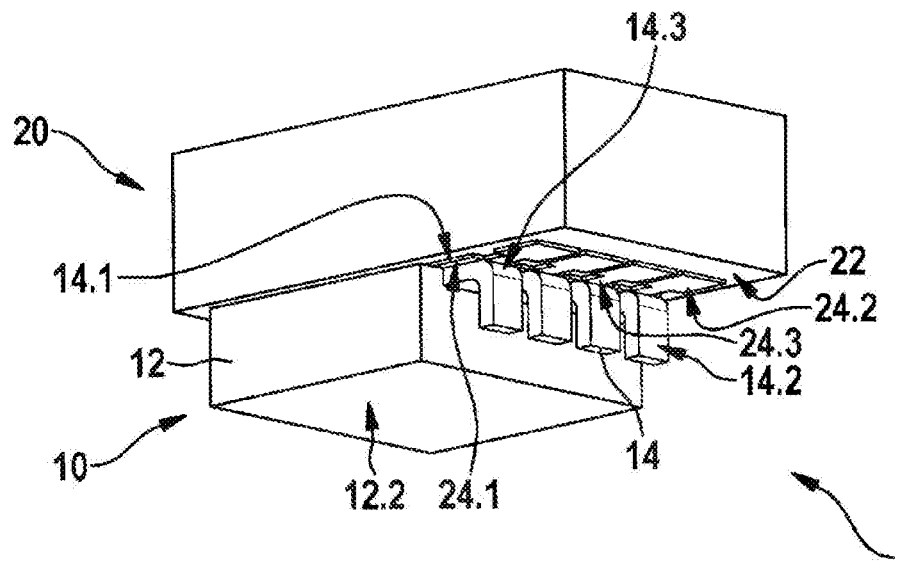
FIG. 4 shows a schematic perspective illustration of the printed circuit board from FIG. 2 with the electronic component from FIG. 1 before the second soldering process.
Figure 6:
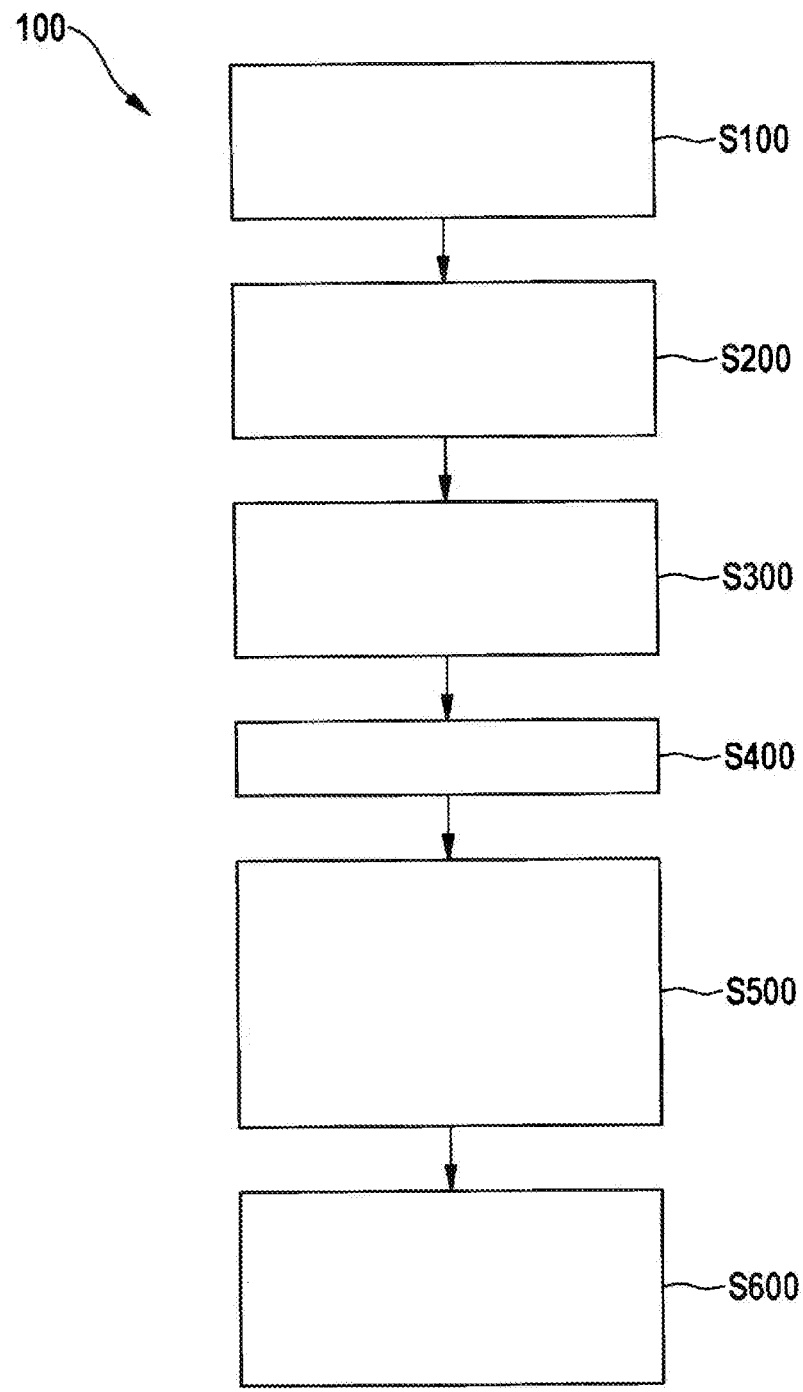
FIG. 6 shows a schematic flowchart of an exemplary embodiment of a method according to the disclosure for mounting an electronic component on a printed circuit board.

As is further shown in FIG. 6, the illustrated exemplary embodiment of the method 100 according to the disclosure for mounting an electronic component 10 on a printed circuit board 20 comprises a step S100 in which soldering paste is applied to the at least one soldering area 24 of the printed circuit board 20. The printed circuit board 20 is then populated with at least one electronic component 10 in step S200 in such a way that the housing 12 rests, by way of the support area 12.1, on the first surface 22 of the printed circuit board 20 and the first contact area 14.1 of the at least one contact element 14 rests on the first section 24.1 of the at least one soldering area 24 and the transition region 14.3 is arranged in the region of the constriction 24.3. FIG. 3 shows the printed circuit board 20 after it has been populated with the electronic component 10. As is further shown in FIG. 3, the first contact areas 14.1 of the four contact elements 14 each rest on a first section 24.1 of the associated soldering area 24 and the four transition regions 14.3 are each arranged in the region of the constrictions 24.3. In step S300, a first soldering process is executed with the populated printed circuit board 20, in which first soldering process the printed circuit board 20 is supplied to a soldering furnace with the first surface 22 pointing upward and the first contact area 14.1 of the contact elements 14 each float on one of the first sections 24.1 of the soldering areas 24. The electronic component 20 is positioned on the printed circuit board in this way. In step S400, the printed circuit board 20 is rotated through 180°. FIG. 4 shows the rotated printed circuit board 20 with the positioned electronic component 10. In step S500, a second soldering process is carried out with the populated printed circuit board 20, in which second soldering process the printed circuit board 20 is supplied to the soldering furnace with the first surface 22 pointing downward, in which soldering furnace the soldering paste on the soldering areas 24 is liquefied again, so that the housing 12 of the electronic component 10, by way of its support area 12, lifts away from the printed circuit board 20 on account of the active force of gravity with a tilting movement over the rounded transition regions 14.3 of the contact elements 14, and the second contact areas 14.2 float on the second section 24.2 of the soldering areas 24, and the support area 12.1 of the housing 12 is at a prespecified angle in relation to the first surface 22 of the printed circuit board 20. In step S600, the solder connection between the second contact area 14.2 of the at least one contact element 14 and the second section 24.2 of the at least one soldering area 24 is executed.

The angle between the support area 12 of the housing 12 and the first surface 22 of the printed circuit board 20 corresponds to the angle between the first contact area 14.1 and the second contact area 14.2 and, in the illustrated exemplary embodiment, has a value of 90°, as is shown in FIG. 5.

In the illustrated exemplary embodiment, the rotation of the printed circuit board 20 is carried out before the solder connection between the first contact area 14.1 of the at least one contact element 14 and the first section 24.1 of the at least one soldering area 24 is cured.

What is claimed is:

1. A connecting arrangement, comprising:
    a printed circuit board including:
        a first surface; and
        at least one soldering area located on the first surface, and having:
            a first section;
            a second section; and
            a constriction that connects the first section to the second section; and
    an electronic component including:
        a housing with a support area that is oriented at a first angle relative to the first surface of the printed circuit board; and
        at least one contact element having:
            a first contact area that runs parallel to the support area;
            a second contact area oriented at a prespecified angle relative to the first contact area, and connected to the second section of the at least one soldering area via a solder connection, wherein the first angle corresponds to the prespecified angle; and
            a rounded transition region located between the first contact area and the second contact area, the rounded transition region positioned to cooperate with the constriction so as to effect a tilting movement of the electronic component when the electronic component moves from a first position in which the first contact area contacts the first section to a second position in which the second contact area is connected to the second section.

2. A connecting arrangement, comprising:
a printed circuit board including:
　　a first surface; and
　　at least one soldering area located on the first surface, and having:
　　　　a first section;
　　　　a second section; and
　　　　a constriction that connects the first section to the second section; and
an electronic component including:
　　a housing with a support area that is oriented at a first angle relative to the first surface of the printed circuit board; and
　　at least one contact element having:
　　　　a first contact area that runs parallel to the support area;
　　　　a second contact area oriented at a prespecified angle relative to the first contact area, and connected to the second section of the at least one soldering area via a solder connection, wherein the first angle corresponds to the prespecified angle; and
　　　　a rounded transition region located between the first contact area and the second contact area and positioned in a region of the constriction of the at least one soldering area,
wherein at least one of the prespecified angle, the first angle, an angle between the first contact area and the first surface, and an angle between the support area and the second contact area has a value in a range from 45° to 90°.

3. The connecting arrangement of claim 2, wherein:
the first section of the at least one soldering area has a surface area that is greater than a surface area of the first contact area of the at least one contact element; and
the second section of the at least one soldering area has a surface area that is greater than a surface area of the second contact area of the at least one contact element.

4. The connecting arrangement of claim 2, wherein the electronic component is a surface-mount device (SMD).

5. The connecting arrangement of claim 2, wherein the electronic component is a sensor element, and further includes a sensor area.

6. The connecting arrangement of claim 5, wherein the sensor area is located on side of the housing of the electronic component that is either opposite the support area or that includes the support area.

7. A connecting arrangement, comprising:
a printed circuit board including:
　　a first surface; and
　　at least one soldering area located on the first surface, and having:
　　　　a first section;
　　　　a second section; and
　　　　a constriction that connects the first section to the second section; and
an electronic component including:
　　a housing with a support area that is oriented at a first angle relative to the first surface of the printed circuit board; and
　　at least one contact element having:
　　　　a first contact area that runs parallel to the support area;
　　　　a second contact area oriented at a prespecified angle relative to the first contact area, and connected to the second section of the at least one soldering area via a solder connection, wherein the first angle corresponds to the prespecified angle; and
　　　　a rounded transition region located between the first contact area and the second contact area and positioned in a region of the constriction of the at least one soldering area,
wherein:
　　the second section of the at least one soldering area has a length that is shorter than a length of the first section of the at least one soldering area; and
　　the second contact area of the at least one contact element has a length that is shorter than a length of the first contact area of the at least one contact element.

8. A method of mounting at least one electronic component on a printed circuit board, comprising:
applying a soldering paste to at least one soldering area located on a first surface of the printed circuit board, the at least one soldering area including a first section, a second section, and a constriction that connects the first section to the second section;
populating the printed circuit board with the at least one electronic component including at least one contact element and a housing with a support area, such that:
　　the support area of the housing rests on the first surface of the printed circuit board;
　　a first contact area of the at least one contact element that runs parallel with the support area rests on the first section of the at least one soldering area; and
　　a rounded transition region of the at least one contact element located between the first contact area and a second contact area of the at least one contact element oriented at a prespecified angle relative to the first contact area is arranged in a region of the constriction;
performing a first soldering process on the populated printed circuit board that includes introducing the populated printed circuit board to a soldering furnace such that the first surface is pointing upwards, and such that the first contact area of the at least one contact element floats on the first section of the at least one soldering area;
rotating the populated printed circuit board by 180°;
performing a second soldering process on the populated printed circuit board to form a solder connection between the second contact area of the at least one contact element and the second section of the at least one soldering area, the second soldering process including:
　　introducing the populated printed circuit board to the soldering furnace such that the first surface is pointing downwards; and
　　re-liquefying the soldering paste on the at least one soldering area such that:
　　　　the support area of the housing of the at least one electrical component lifts away from the printed circuit board due to gravity with a tilting movement over the rounded transition region of the at least one contact element;
　　　　the second contact area of the at least one contact element floats on the second section of the at least one soldering area; and
　　　　the support area of the housing is at a first angle relative to the first surface of the printed circuit board; and
curing the solder connection between the second contact area of the at least one contact element and the second section of the at least one soldering area.

9. The method of claim 8, wherein the rotation of the populated printed circuit board is performed before a solder connection between the first contact area of the at least one contact element and the first section of the at least one soldering area is cured.

10. The method of claim 9, wherein the first angle between the support area of the housing and the first surface of the printed circuit board corresponds to the prespecified angle between the first contact area and the second contact area of the at least one contact element.

\* \* \* \* \*